United States Patent [19]
Appel et al.

[11] Patent Number: 5,371,526
[45] Date of Patent: Dec. 6, 1994

[54] RASTER OUTPUT SCANNER FOR A SINGLE PASS PRINTING SYSTEM WHICH SEPARATES PLURAL LASER BEAMS BY WAVELENGTH AND POLARIZATION

[75] Inventors: James J. Appel, Brighton, N.Y.; Thomas L. Paoli, Los Altos, Calif.

[73] Assignee: Xerox Corporation, Stamford, Conn.

[21] Appl. No.: 948,530

[22] Filed: Sep. 22, 1992

[51] Int. Cl.⁵ .................... G02B 26/10; B41J 2/435
[52] U.S. Cl. ................................ 346/108; 359/204
[58] Field of Search ............... 346/108, 107 R, 76 L, 346/1.1, 160; 359/206, 204, 207, 217

[56] References Cited

U.S. PATENT DOCUMENTS

| | | |
|---|---|---|
| 4,393,387 | 7/1983 | Kitamura . |
| 4,404,571 | 9/1983 | Kitamura . |
| 4,423,426 | 12/1983 | Kitamura . |
| 4,445,126 | 4/1984 | Tsukada . |
| 4,474,422 | 10/1984 | Kitamura . |
| 4,591,903 | 5/1986 | Kawamura et al. . |
| 4,716,568 | 12/1987 | Scifres et al. . |
| 4,786,918 | 11/1988 | Thornton et al. . |
| 4,847,642 | 7/1989 | Murayama et al. . |
| 4,903,067 | 2/1990 | Murayama et al. . |
| 4,962,312 | 10/1990 | Matuura et al. . |
| 4,978,976 | 12/1990 | Okino . |
| 5,014,075 | 5/1991 | Okino . |
| 5,089,908 | 2/1992 | Jodoin et al. . |
| 5,179,462 | 1/1993 | Kageyama et al. . |
| 5,181,137 | 1/1993 | Kiode .................. 359/217 |
| 5,243,359 | 9/1993 | Fisli . |
| 5,291,223 | 3/1994 | Ogane et al. . |

Primary Examiner—Mark J. Reinhart
Attorney, Agent, or Firm—Oliff & Berridge

[57] ABSTRACT

A raster output scanner (ROS) laser diode architecture produces plurality of laser beams, having dissimilar wavelengths and dissimilar polarizations which are passed through wavelength and polarization discriminating optics to alternately pass or reflect the beams that have been scanned by a single polygon mirror. Polarization of the beams is accomplished via post emission polarizers, such as, for example, half-wave plates. These separated beams then expose their associated photoreceptors, for example, of a multistation printer, with a rasterized image that is subsequently transferred to a support medium such as plain paper, and developed into an image.

38 Claims, 5 Drawing Sheets

RASTER OUTPUT SCANNER FOR A SINGLE PASS PRINTING SYSTEM WHICH SEPARATES PLURAL LASER BEAMS BY WAVELENGTH AND POLARIZATION

CROSS-REFERENCE TO RELATED APPLICATIONS

This application is related to concurrently filed U.S. patent application Ser. No. 07/948,512 to James Appel et al., entitled "A Raster Output Scanner for a Multi-Station Xerographic Printing System Having Laser Diodes Arranged In a Line Parallel to the Fast Scan Direction", filed concurrently herewith, to U.S. patent application Ser. No. 07/812,238 to Tibor Fisli, entitled "A Raster Output Scanner For A Multistation Xerographic Printing System", to concurrently filed U.S. patent application Ser. No. 07/948,531 to Thomas L. Paoli, entitled "Diode Laser Multiple Output Scanning System", and to concurrently filed U.S. patent application Ser. No. 07/948,511 to John R. Andrews entitled "A Raster Output Scanning Arrangement For A Printing Machine".

1. Field of the Invention

The present invention relates to multistation xerographic printers utilizing a shared raster output scanner, and in particular, to architectures and characteristics of laser diode arrays used in such shared raster output scanners.

2. Background of the Invention

Flying spot scanners (often referred to as raster output scanners (ROS)) conventionally have a reflective multifaceted polygon mirror that is rotated about its central axis to repeatedly sweep one or more intensity modulated beams of light across a photosensitive recording medium in a line scanning direction (also known as the fast-scan direction) while the recording medium is being advanced in an orthogonal, or "process", direction (also known as the slow-scan direction) such that the beams scan the recording medium in accordance with a raster scanning pattern. Digital printing is performed by serially intensity modulating each of the beams in accordance with a binary sample stream, whereby the recording medium is exposed to the image represented by the samples as it is being scanned. Printers that sweep several beams simultaneously are referred to as multibeam printers. Both ROS and multibeam printer techniques are illustrated in U.S. Pat. No. 4,474,422 to Kitamura, the disclosure of which is incorporated herein by reference.

In the Kitamura patent, multiple lasers are arranged diagonally (see FIG. 10B of the Kitamura patent) to sweep multiple beams across a single photoreceptor. The beams are also displaced from each other in the cross-scan direction so that multiple lines can be scanned simultaneously across the photoreceptor. An object of the Kitamura patent is to reduce variations in pitch by spacing individual lasers within the laser array closely in a compact structure.

High speed process color and multi-highlight color xerographic image output terminals require multiple independently addressable raster lines to be printed simultaneously at separate locations. This is called multi-station printing. Conventional architectures for multi-station process color printers use a plurality of separate ROSs, usually four independent: ROSs as illustrated in U.S. Pat. Nos. 4,847,642 and 4,903,067 to Murayama et al., the disclosures of which are incorporated herein by reference.

Problems with these systems include the high cost related to the cost of multiple ROSs, the high cost of producing nearly identical multiple ROSs and the difficulty of registering system colors.

A partial solution to the problems of multi-station xerographic systems with individual ROSs is disclosed in U.S. Pat. No. 4,591,903 to Kawamura et al. U.S. Pat. No. 4,591,903, particularly with regard to FIG. 6, discloses a recording apparatus (printer) having multiple recording stations and multiple lens systems, but only two polygon mirrors and only one drive motor. With only two polygon mirrors and only one associated drive motor, the cost of the system is reduced. However, differences in the lenses, the polygon and mirror surfaces could still cause problems with color registration.

Another approach to overcoming the problems of multi-station printers having individual ROSs is disclosed in U.S. Pat. No. 4,962,312 to Matuura. In U.S. Pat. No. 4,962,312 a plurality of beams are overlapped using an optical beam combiner. The overlapped beams are deflected using a single polygon mirror, and are then separated using an optical filter (and polarizers if more than two beams are used). The separated beams are then directed onto associated photoreceptors. The advantage of overlapping the laser beams is a significant cost reduction since a single ROS (i.e., the polygon mirror and all associated optics) is shared by all the stations.

However an actual embodiment of the apparatus described in U.S. Pat. No. 4,962,312 would be rather complicated and expensive, especially if four system colors are to be printed. The use of optical beam combiners to overlap beams so that they have similar optical axes would be difficult, expensive and time consuming. Obtaining similar size spots on each photoreceptor would also be difficult because it would be difficult to establish the same optical path length for each beam. It would also be difficult to ensure that the latent images on the photoreceptors are properly registered. Each of these problems is at least partially related to the relative positions of the laser sources and the use of separate laser sources that are subsequently combined.

U.S. Pat. No. 5,243,359 to Tibor Fisli, the disclosure of which is incorporated herein by reference in its entirety, discloses a ROS system suitable for deflecting multiple laser beams in a multi-station printer. In U.S. Pat. No. 5,243,359 the rotating polygon mirror simultaneously deflects a plurality of clustered, dissimilar wavelength laser beams having their largest divergence angles parallel to one another, that are subsequently separated by a plurality of optical filters and directed onto their associated photoreceptors. Similarly dimensioned spots are obtained on each photoreceptor by establishing similar path lengths for each beam. This is facilitated by locating all lasers in one integral unit. However, the laser diodes illustrated in U.S. Pat. No. 5,243,359 are arranged in a line in a cross-scan direction. i.e., parallel to the axis of rotation of the polygon mirror (see FIG. 2 of U.S. Pat. No. 5,243,359. Diodes arranged in the cross-scan direction must be fabricated such that they are packed closely together in a direction parallel to the polygon mirror rotation axis to minimize beam characteristic deviations such as spot size, energy uniformity, bow and linearity. That is, the laser diodes are kept as close together as possible in the direction parallel to the polygon mirror rotation axis (i.e., the height direction of the polygon mirror) so that the light beams strike as nearly the same portion of the polygon mirror as is possible. However, since the light beams are spaced from each other in the height direction of the polygon mirror, the beams do not all strike the same portions of each facet of the polygon mirror, and therefore, are not uniformly reflected. Additionally, locating the laser diodes close to each other introduces crosstalk. It is also difficult to fabricate such closely spaced diodes that emit light at sufficiently different wavelengths.

A partial solution to the problems encountered with this multistation printer apparatus is disclosed in U.S. patent application No. 07/948,531, to Thomas L. Paoli, the disclosure of which is incorporated herein by reference in its entirety. U.S. patent application Ser. No. 07/948,531 discloses a ROS system in which the rotating polygon mirror simultaneously deflects a plurality of orthogonally polarized and dissimilar wavelength laser beams having their largest divergence angles parallel to one another, that are subsequently separated by a polarized beam separator and a plurality of dichroic beam separators and directed onto their associated photoreceptors. Similarly dimensioned spots are obtained on each photoreceptor by establishing similar path lengths for each beam. This is facilitated by locating all lasers in one integral unit. However, the laser diodes illustrated in U.S. patent application Ser. No. 07/948,531 are arranged in a line in a cross-scan direction, (i.e., parallel to the axis of rotation of the polygon mirror). Diodes arranged in the cross-scan direction must be fabricated such that they are packed closely together in a direction parallel to the polygon mirror rotation axis to minimize beam characteristic deviations such as spot size, energy uniformity, bow and linearity. That is, the laser diodes are kept as close together as possible in the cross scan direction so that the light beams strike as nearly the same portion of the polygon mirror as is possible. However, since the light beams are spaced from each other in the height (i.e., cross scan) direction of the polygon mirror, the beams do not all strike the same portions of each facet of the polygon mirror, and therefore, are not uniformly reflected. Additionally, locating the laser diodes close to each other introduces crosstalk between the laser outputs and added complexity of diode fabrication especially for lasers with different wavelengths and cross-polarizations.

Commonly assigned, concurrently filed, U.S. patent application Ser. No. 07/948,531 entitled, "A Raster Output Scanner For A Multi-Station Xerographic Printing System Having Laser Diodes Arranged In A Line Parallel to the Fast Scan Direction", to James J. Appel et al.,the disclosure of which is incorporated herein by reference in its entirety, discloses a ROS architecture in which the laser diodes are positioned along a line that is parallel to the fast scan direction of the ROS (i.e., perpendicular to the rotation axis of the polygon mirror). In this type of architecture, the requirement to have laser diodes closely packed (typically spaced by 10 μm) can be relaxed. This enables multiple laser diodes, at widely separated wavelengths, to be spaced a convenient distance apart thus simplifying their fabrication. For example, diode separation can be relaxed to 333 μm, or 0.33 mm. In such an example, the distance between the first and last diodes in a four laser array (typical for color printing application) is 1 mm. However, the light beams are separated by wavelength only, and therefore, laser diodes that emit light at four appropriately spaced wavelengths are required. It can be difficult to reproducibly fabricate such diodes that fall within the range of spectral sensitivity of certain photoreceptors on a single chip.

SUMMARY OF THE INVENTION

It is therefore an object of this invention to provide a multiple laser ROS system in which laser diode spacing and operating bandwidth constraints can be relaxed, thereby easing fabrication and reducing costs.

In order to realize this and other objects, and to overcome the shortcomings set forth above, a raster output scanner for a multi-station printer includes a light source for emitting a plurality of clustered light beams having at least one pair of light beams, each pair of light beams having similar wavelengths, dissimilar from other pairs, and means for polarizing a first one of the light beams of each pair to have a polarization different from a second light beam of each pair. The raster output scanner also includes a polygon mirror for simultaneously deflecting the light beams, and an optical separator means for differentially passing or reflecting said light beams based on their wavelengths and polarizations. The separated light beams are then directed by, for example, mirrors onto associated photoreceptive regions of a single station/multiple position printer, or to a photoreceptor located at an associated station of a multistation printer.

Differentially polarizing the light beams enables the number of different wavelengths that must be produced by the light source to be reduced by a factor of two.

Preferably, the light source includes a plurality of laser diodes arranged in a line that extends parallel to the fast scan direction so that the light beams from each diode reflects from the same portion of the polygon mirror.

By using polarizing half-wave plates, located externally to the light source, to polarize one of the light beams from each pair, the diodes can be arranged on a substrate so that they will all emit light having their larger divergence angles oriented in the fast scan direction. This simplifies the optics used in the raster output scanner.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

While this invention is described in some detail herein, with specific reference to certain illustrated embodiments, it is to be understood that there is no intent to be limited to those embodiments. On the contrary, the aim is to cover all modifications, alternatives and equivalents falling within the spirit and scope of the invention as defined by the claims.

To reduce the total emission bandwidth required for separable beams, the present invention introduces polarization of the optical beams as an additional degree of freedom. In this architecture, there are a number of diodes arranged in pairs, with diodes within each pair emitting light at similar wavelengths, while each pair emits light at a wavelength different from the other pairs. The polarization of the light emitted by one of the lasers within each pair is rotated to be different from the polarization of the light of the other beam by, for example, 90° so that the two beams can be distinguished, and thus separated from each other. Preferably, the difference in polarization is achieved by providing polarizing plates in the path of at least some of the light beams so that the polarization thereof is rotated by, for example, 90°. The pair of light beams, while having the same wavelength, are differentiated by their different polarizations. The beams can then be separated by post polygon optics in accordance with both wavelength and polarization characteristics of the light beams.

When an even number of diodes are provided, each pair of diodes output beams having a common wavelength as described above. Beams having similar wavelengths are distinguished from each other by polarization. When an odd number of diodes are provided (for example, 3, 5, 7, etc.), one or more pairs of diodes result (with each pair emitting beams having a distinct wavelength), and the odd diode is fabricated so as to emit a beam having a wavelength different from the wavelengths of each of the pairs.

Preferably, the laser diodes are arranged in a line parallel to the fast scan direction so that the advantages disclosed in related U.S. patent application Ser. No. 07/948,572 are achieved. The ROS optics is then designed to overscan in the fast scan direction so that beams from each of the laser diodes completely cover the desired scan line lengths. This overscan is necessary since, when the diodes are arranged in a line that extends in a direction perpendicular to the axis of rotation of the polygon mirror, each of the laser diodes emits a beam which is incident on the polygon at a slightly different angle of incidence than the other beams. Any number of conventional provisions can be made to provide for overscan.

The beams are then reflected off the polygon and pass through a scan lens. The beams are then separated, for example, by filters and polarized beam separators which differentially pass or reflect the light beams based on their different wavelengths and polarizations, respectively.

Figure 1:
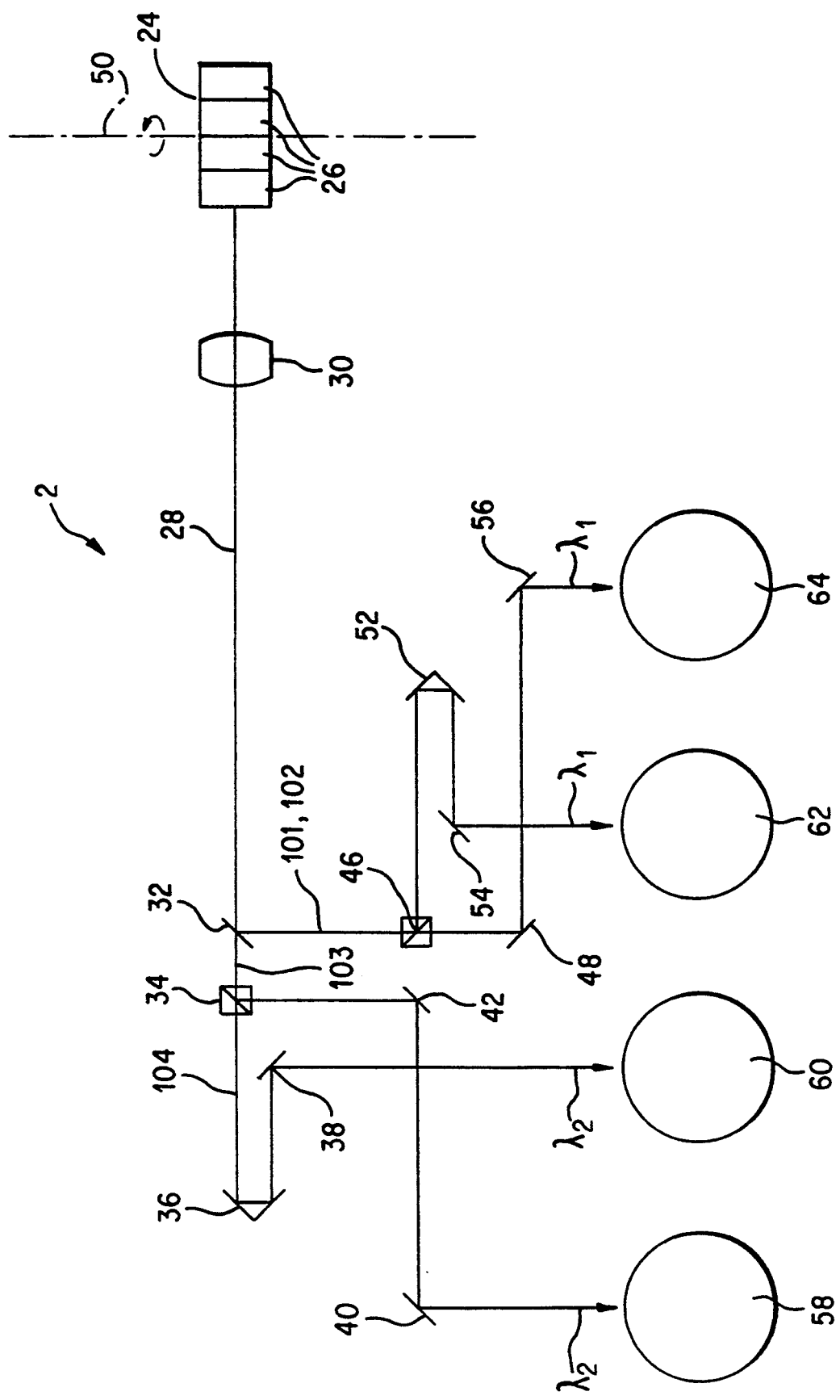
FIG. 1 is a simplified schematic side view of a ROS system according to an embodiment of the present invention.
Figure 2:
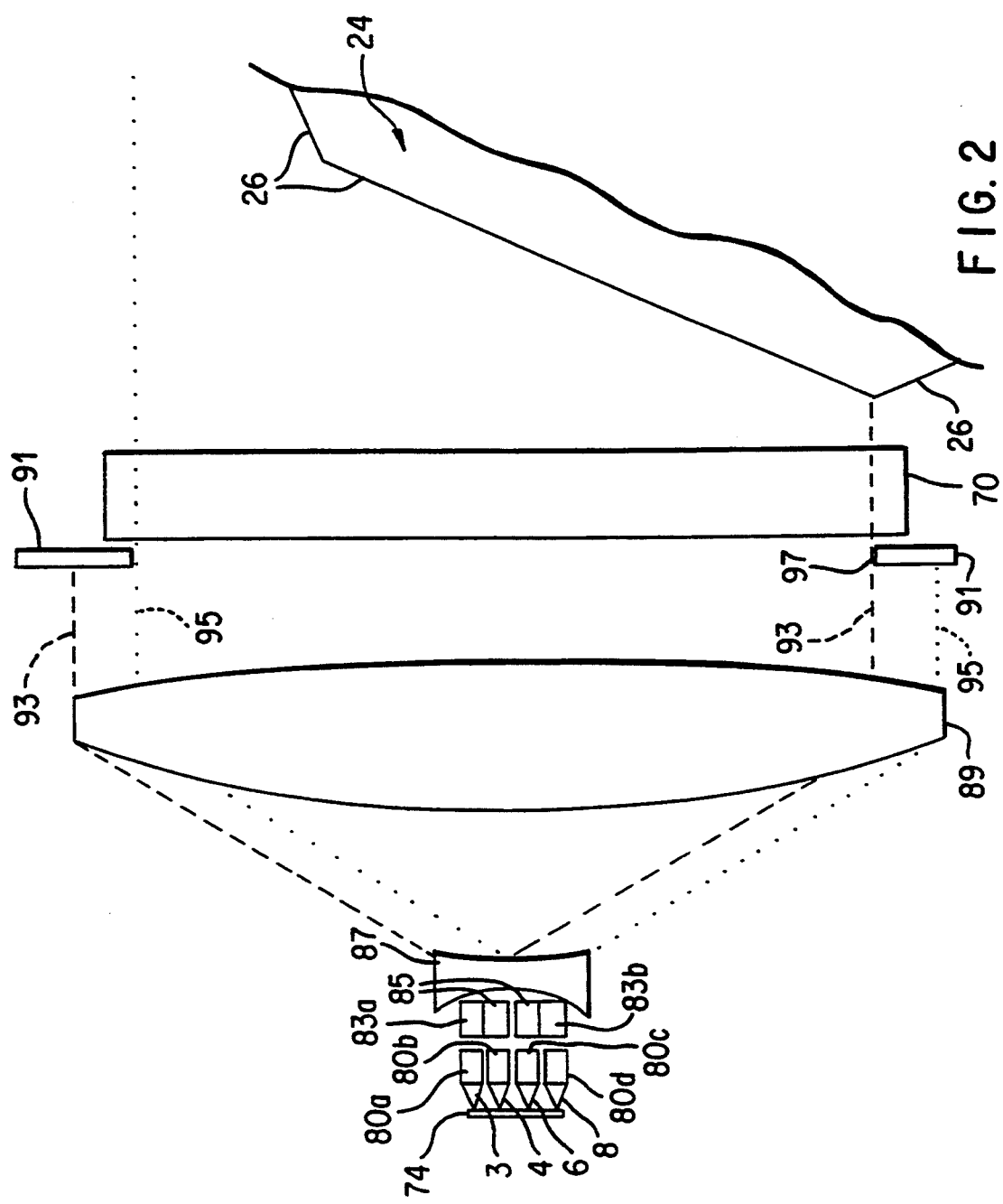
FIG. 2 is a schematic top view of a multiple diode array and one example of post emission optics used to practice the invention.

The functions described above are accomplished via the ROS optics 2 as shown in FIGS. 1 and 2, which illustrate a preferred embodiment of the present invention useful for process color printing with four colors at four stations. In FIG. 2, a plurality of diodes 3, 4, 6, 8 which define a plurality of pairs of diodes, form a laser diode array light source 74. In an illustrative four laser diode system (typical for full-color printing applications), shown in FIG. 2, a laser diode pair comprised of laser diodes 3 and 4 emit light having a wavelength $\lambda_1$, and another laser diode pair, comprised of laser diodes 6 and 8, emit light having a wavelength $\lambda_2$. In the illustrated embodiment, the direction of polarization, and the largest divergence angle of the light beams emitted by all four laser diodes initially are the same.

Four GRIN rods 80a, 80b, 80c, 80d are positioned close to the emitting surfaces of the four laser diodes 3, 4, 6, 8. These four GRIN rods 80a, 80b, 80c, 80d collimate the light emitted by the diodes. Accordingly, GRIN rods 80a, 80b, 80c, 80d output four collimated parallel beams of light having elliptical cross-sections. Two half-wave plates 83a, 83b are placed in the paths of the light beams emitted by the outermost diodes 3,8 in the array 74 after the GRIN rods 80a, 80d. The half-wave plates rotate the direction of polarization of the light beams emitted by the two outermost diodes 3,8 by, for example, substantially 90 degrees. A different half-wave plate is used for each outside laser diode (diodes 3 and 8) because the laser diodes are emitting light having different wavelengths.

Plain parallel pieces of glass 85, of an appropriate thickness and index of refraction are positioned in the paths of the light beams emitted by the two inside diodes 4, 6 to keep the optical path length of all four diodes equivalent. Alternatively, a single glass plate could be used to adjust the optical path length of the two inner light beams 4,6.

As another alternative, plates which rotate the polarization by angles other than 90° can be used. Additionally, both light beams of each pair could be rotated in different directions by, for example, 45° so that the resulting beams are offset by 90°. In such a case, glass 85 would not be required.

Alternatively, a liquid crystal polarizer, as disclosed in U.S. patent application Ser. No. 07/948,511 entitled "A Raster Output Scanner For A Printing Machine" to John R. Andrews, the disclosure of which is incorporated herein by reference can be used in place of the GRIN rod and half-wave plate as another means for polarizing light beams. Using liquid crystal polarizers eliminates the need for GRIN rods because liquid crystal polarizers do not require collimated light to function properly. In addition, a single substrate can be used to form all liquid crystal polarizers necessary for a clustered-light beam emitting light source, with portions of the substrate being formed to have no liquid crystal material located in the path of light beams which are not to have their direction of polarization rotated in order to perform the optical path length compensation function of the plain parallel pieces of glass used in FIG. 2.

A spherical beam expanding lens system 87, 89 follows the halfwave plates 83a, 83b and optical path length adjuster 85, and expands the four beams 3, 4, 6, 8 in the fast-and cross-scan directions. Because the four beams preceding beam expander 87, 89 are parallel, the four expanded beams will be parallel also, but slightly displaced from each other in the fast scan direction (this is discussed in more detail below). An aperture 97 provided in a plate 91 then truncates these four expanded beams to their mutually overlapping widths. The beams pass through a cylinder lens 70 and then are reflected off a facet 26 of a polygon mirror 24 so as to follow a first optical path 28. As shown in FIG. 1, polygon mirror 24 rotates about its central axis 50. After the beams have been reflected off the rotating polygon mirror 24, they then pass through a conventional scan lens 30.

The beams are then separated by a dichroic beam separator 32 which differentially passes or reflects light of different wavelengths. That is, the light beams 101,102 having the wavelength $\lambda_1$, produced by diodes 3 and 4 are reflected by dichroic beam separator 32, while the light beams 103, 104 having the wavelengths $\lambda_2$ produced by diodes 6 and 8 pass through separator 32. By first separating the light by wavelength, polarized beam separators 34, 46 which operate at different wavelengths can be provided. Since light beams 103, 104 produced by diodes 6 and 8 have different polarization directions, light beam 104 passes through separator 34, while beam 103 is reflected by separator 34. Similarly, the polarization direction of beams 101 and 102 differ, and therefore one of these light beams passes through separator 46, while the other is reflected thereby. Polarized beam separators 34, 36 can be, for example, prisms, or polarization selective multiple layer films. Beam separators 34, 46 separate the beams based upon their different polarization directions, and then direct the separated light beams onto their associated optical paths. Thus, dichroic beam separator 32 and polarized beam separators 34 and 46 together function as an optical separator means for differentially passing and reflecting light beams 101, 102, 103 and 104 onto alternate optical paths according to wavelength and polarization direction of the light beams. Since the system illustrated in FIG. 1 simultaneously forms, sweeps and deflects each light beam and since each beam is from substantially the same spatial location and have parallel optical axes, similarly dimensioned beams are input to the wavelength discriminating separator 32 and the polarized beam separators 34, 46. Thus, the problem of maintaining equal optical path lengths for each of the beams reduces to the much simpler problem of maintaining substantially equal optical path lengths from the polarized beam separators 34, 46 to the photoreceptors 58, 60, 62, 64. Substantially equal path lengths are set by properly adjusting the optical path lengths after the polarized beam separators 34, 46 by properly positioning mirrors 36, 38, 40, 42, 48, 52. 54, 56. Equalization of optical path lengths results in similarly dimensioned spots at each photoreceptor 58, 60, 62, 64. Equalization of the optical path lengths as disclosed in the present invention is significantly easier than adjusting the positions of optically separated lasers at the input to the collection optics as disclosed in previously described U.S. Pat. No. 4,962,312 to Matuura. It is understood that other arrangements are possible depending on the number of beams to be separated and the sequence of beam separation (i.e., by wavelength, followed by polarization, or vice versa).

Figure 3:
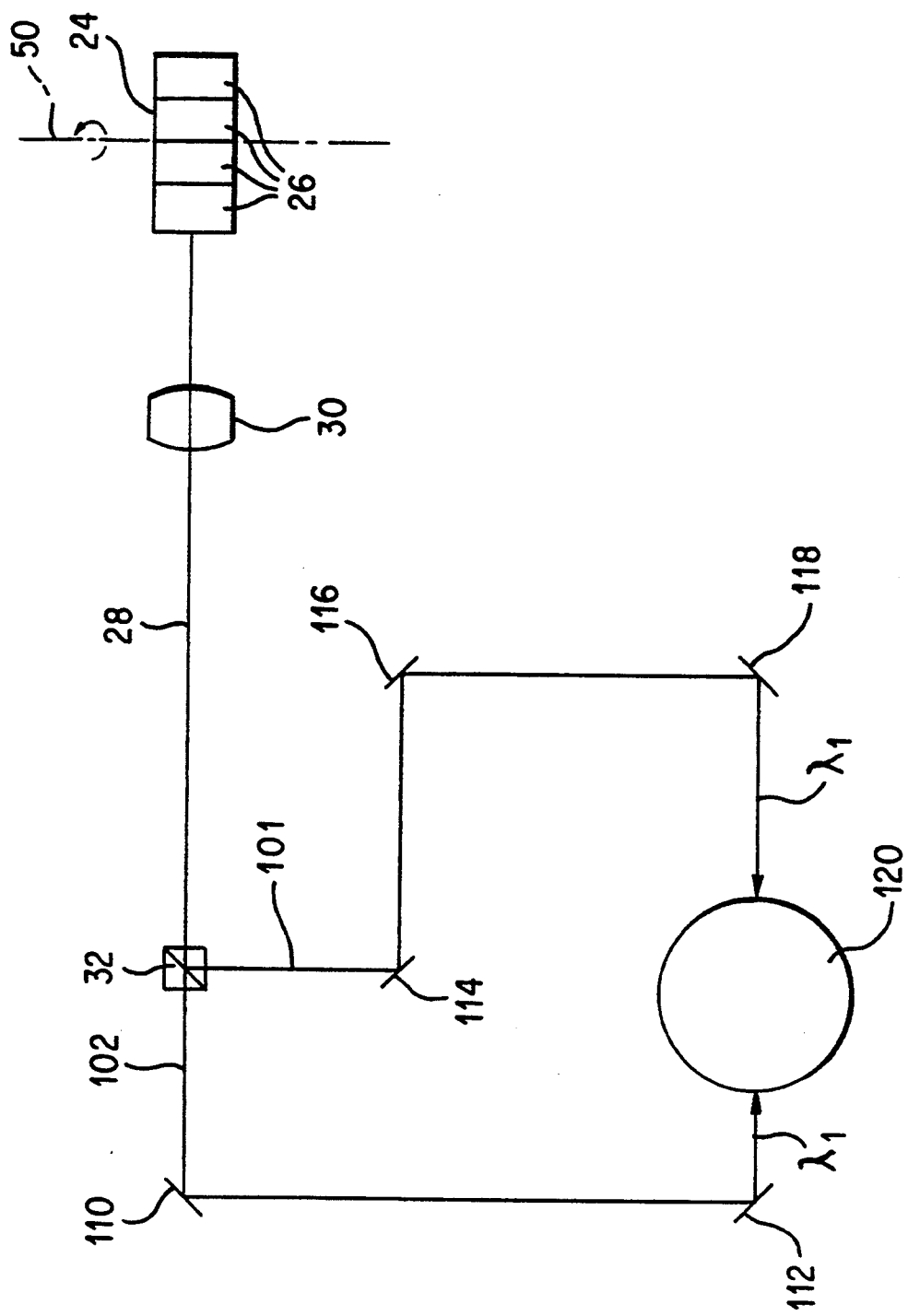
FIG. 3 is a simplified schematic view of a single photoreceptor printer according to an embodiment of the present invention.

In an alternative embodiment, illustrated by FIG. 3, a printer having a single photoreceptor 120, for example, a belt or drum, architecture can be used. In this embodiment multiple beams 28 of differing polarizations but similar wavelengths $\lambda_1$, for example, are deflected off a facet 26 of the polygon mirror 24 as it rotates about its central axis 50. Once deflected, the beams 28 pass through the corrective scan lens 30 which corrects the beams 28 for any beam characteristic variations caused by the polygon 24. After passing through the corrective optical system 30, the beams 28 are separated based on their polarizations by a polarized beam separator 32. One of the beams 101 is reflected while another beam 102 is passed. These beams 101,102 are then directed to the proper exposure position on the multiple position photoreceptor 120 by mirrors 110, 112, 114, 116, 118.

The architectures shown in FIGS. 1 and 3 are known as single pass, multicolor printers because a sheet needs to pass by the multiple photoreceptors of FIG. 1, or by the single photoreceptor of FIG. 3 a single time in order to have multiple toner patterns (usually having different colors) deposited thereon.

In FIG. 2, where the diodes 3, 4, 6 and 8 are arranged in a line parallel to the fast scan direction (i.e., perpendicular to the rotation axis 50 of polygon mirror 24), the beam spacing is not subject to the extreme design constraints associated with laser diodes that are arranged in a line extending in a cross scan direction. Since all of the diodes are widely spaced along a line parallel to the fast scan direction, all of the diode characteristic variations such as differential bow, and scan linearity are eliminated. Thus, all the advantages associated with multistation single optics are realized, while the need to make closely packed laser diode arrays of dissimilar wavelengths is avoided.

Thus, with this configuration, the advantages enumerated in U.S. Pat. No. 07/812,238 and concurrently filed U.S. patent application Ser. No. 07/948,512 are obtained, while the need to make closely packed laser diode arrays with four widely spaced wavelengths is avoided. Since the four beams are positioned along a line parallel to the fast scan direction, all differential bow is eliminated. Thus the four beams have identical bow, wobble, jitter, mag, scan line position and scan line linearity.

In many multiple diode arrays designed for use with single station xerography, the diodes are typically spaced 10 $\mu$m apart. When the diodes are arranged in a line parallel to the fast scan direction, this spacing constraint can be relaxed. If the inter-diode spacing were relaxed, for example, by a factor of 33, to 333 microns, or 0.33 mm, the distance from the first to the last laser diode, in a four diode array (typical for color printing applications), would be 1 mm. GRIN rods can easily be fabricated with diameters less than 0.33 mm for use with such an inter-diode spacing.

With this 0.33 mm inter-diode spacing, the centers of the four beams in the fast scan direction are displaced, following beam expander 87, 89, by 1 mm. This 1 mm displacement is a small fraction of the width of the beams in the fast scan direction which is usually on the order of 20 mm. This is illustrated in FIG. 2 in which dashed lines 93 illustrate the expanded beam output by diode 3 at one end of light source 74, and dotted line 95 illustrates the expanded beam output by diode 8 at the opposite end of light source 74. As is clear from FIG. 2, although a majority of the light beams overlap, end portions thereof do not. Aperture 97 provided in plate 91 of the optical system permits only the overlapping portions of these beams to reach polygon 24.

Accordingly, the ROS optics is designed to overscan in the fast scan direction so that the scan line length over which all the beams overlap is the desired scan line length. That is, the ROS optics is designed to cover a larger scan line length than would be needed if the diodes were oriented on a line in the cross scan direction. This overscan is necessary since each of the laser diodes emits a beam that would be incident on the polygon at slightly different feed angles of incidence, thus causing the scan lines from the different diodes to be offset from each other in the fast scan direction. Feed angle is defined as the angle between the prepolygon beam and post polygon beam at center of scan. Typical ROS designs are very insensitive to changes in feed angle. The effect on scan linearity of relatively large changes in feed angle is very small because the beam from each diode travels through the same portion of the scan lens to arrive at any given point along the scan line, independent of the feed angle. The effect of changes in feed angle on spot intensity and fast scan spot width is also very small because these parameters are very slowly varying functions of the beam geometry.

It is understood that the timing of the data sent to the separate beams would be adjusted electronically to account for the differing feed angles of the different beams. Any number of conventional provisions can be made to provide for overscan. The beams are then reflected off polygon 24, and pass through scan lens 30 to be separated and directed to the photoreceptors as described above. For purposes of this illustration, it is assumed that the ROS scan lens 30 contains a toroidal element to provide wobble correction. However, the ideas in this application also apply to a ROS optical system which uses a cylinder mirror following a spherical scan lens, a cylinder mirror following a cylindrical scan lens, a cylinder mirror following a cylindrical/spherical scan lens or a cylinder lens very near the photoreceptor to provide wobble correction.

Figure 4:
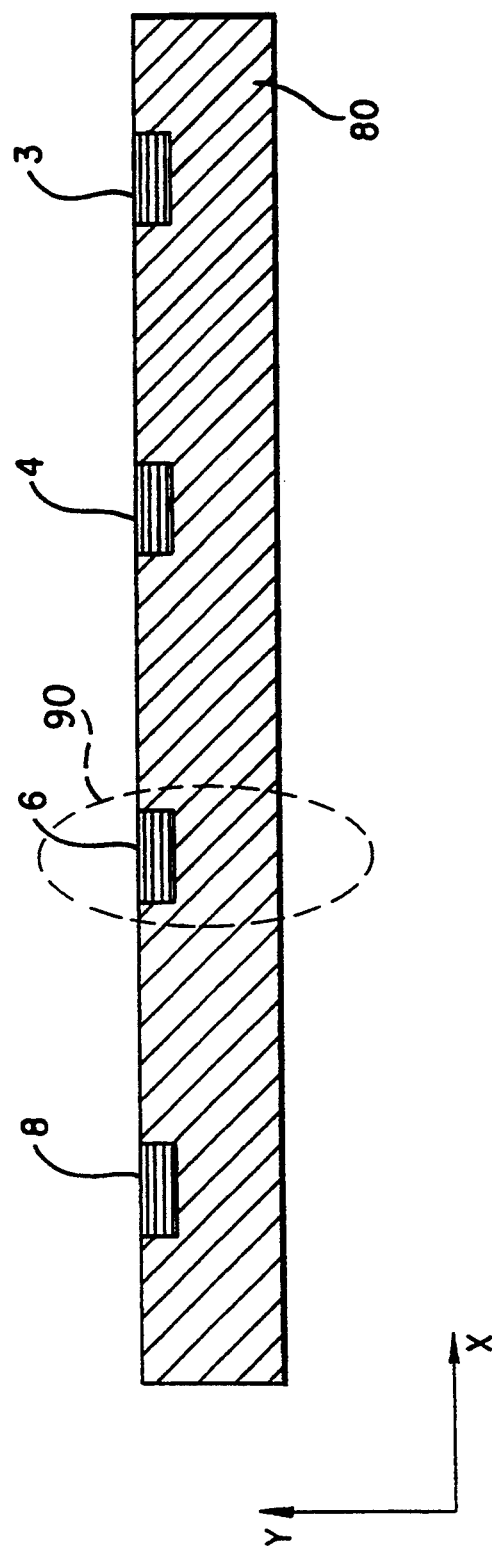
FIG. 4 is a front view of a laser diode array in which four diodes are arranged in a line on one chip.
Figure 5:
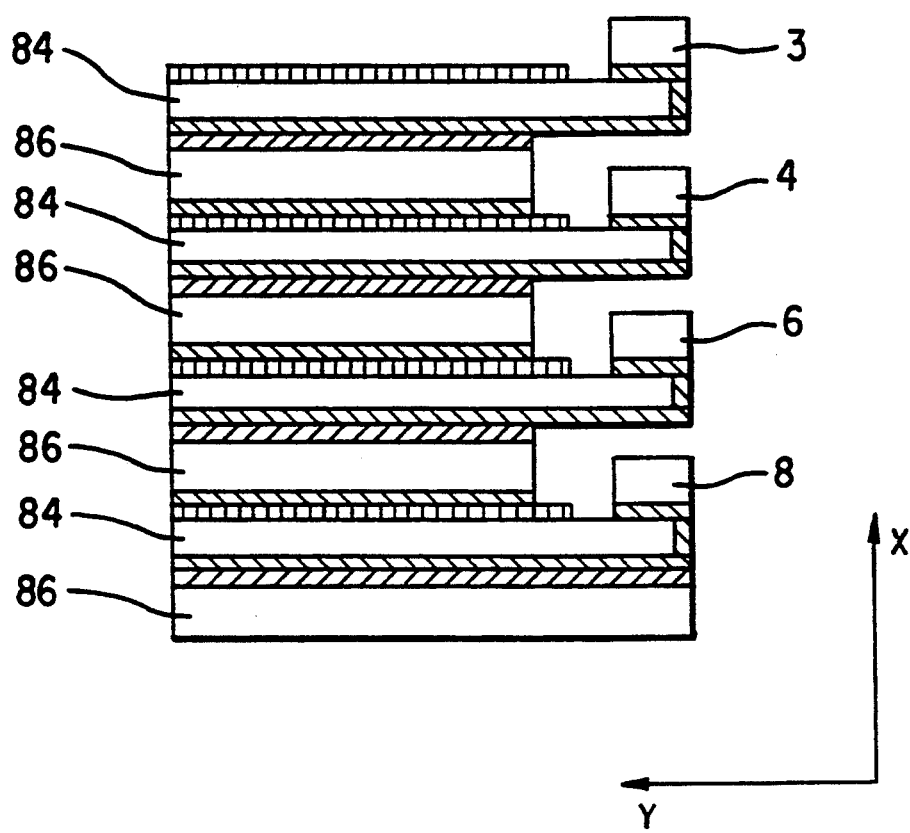
FIG. 5 is a side view of four individual laser diodes fabricated on a mechanical support structure.

The laser diodes could all be fabricated on a single chip 80, as shown in FIG. 4 and disclosed in U.S. patent application Ser. No. 07/579,218, entitled "Semiconductor Structures Fabricated Via Photo Induced Evaporation Enhancement During In Situ Epitaxial Growth", the disclosure of which is incorporated herein by reference, or they can be fabricated on separate chips, as shown in FIG. 5, which are then bonded together. From an optical design perspective, the larger divergence axis (90 in FIG. 4) of the light beam output by the diodes should be in the fast scan direction (denoted by the arrow X in the Figures). This can best be achieved with separate chips.

Lasers can be assembled as shown in FIG. 5 using the techniques described in U.S. Pat. No. 4,716,568, the disclosure of which is incorporated herein by reference. In the embodiment shown in FIG. 5 an insulating material such as, for example, BeO, is used for spacers 86 and mounting plates 84. The spacers can be 150 μm thick, while the mounting plates can be 100 μm thick. Thus, four lasers 3, 4, 6, 8 can be easily assembled within 1 mm in the fast can direction. Using alignment marks and micropositioning in the assembly process, it is possible to place the chips within 2 μm of a line in the fast scan direction, shown by the arrow X. On the other hand, if the diodes are fabricated on a single chip, using conventional technology, as in FIG. 4, the larger divergence axis 90 will be perpendicular to the fast scan direction. The FIG. 4 configuration will also work but will require a longer focal length, larger diameter GRIN rod.

In the source architectures illustrated in FIGS. 4 and 5, the direction of polarization, and the largest divergence axis 90 of the light beams emitted by all four lasers are the same when the beams are initially output by the diodes (i.e., prior to reaching the polarizing plates). However the common direction of polarization is orthogonal to the common direction of large divergence. This results because all diodes are arranged with their longer width in the same plane (as in FIG. 4), or in parallel planes (as in FIG. 5). By ensuring that the largest divergence axis of the light beams emitted by all diodes are parallel (i.e., their divergence angles are the same), a maximum amount of the light beams is passed through the scanner optics.

A logical extension to the architectures described above is to fabricate multiple lines of, for example, four diode arrays on a single chip in a two dimensional array. Such a staggered array can be fabricated monolithically by separately addressing lasers grown on a grooved substrate as described in U.S. Pat. No. 4,786,918, the disclosure of which is incorporated herein by reference. Arrays as large as 4×4 can be obtained by combining two of the staggered arrays. Alternatively, 4×4 arrays can be obtained by replacing the separate single lasers, for example of FIG. 5, with linear monolithic arrays of four diodes operating at the same wavelength. Independent addressing of each laser in each monolithic array is accomplished by patterning the metal on the mounting plate and spacer. Simultaneous writing of multiple lines achieved in these ways can be used to increase the speed of the system. That is, the output beams from each diode array would be directed to each of the stations instead of the output beam from a single diode for each station as described above.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as defined in the following claims.

What is claimed is:

1. A raster output scanner for providing a plurality of light beams to separate and distinct optical paths, comprising:
    a light source which emits a plurality of clustered light beams including at least one pair of light beams, each pair of light beams having similar wavelengths, dissimilar from other pairs;
    polarization means, disposed in an optical path of said light beams, for varying a polarization of one light beam within each pair of light beams;
    deflecting means, for simultaneously deflecting said clustered light beams onto a first optical path, said clustered light beams remaining separate during deflection by said deflection means; and
    optical separator means for differentially passing and reflecting said light beams onto alternate optical paths according to a wavelength and a polarization direction of said light beams.

2. The raster output scanner of claim 1, wherein said light source includes first and second pairs of laser diodes, said first pair of laser diodes emitting light beams having a wavelength different from a wavelength of light beams output by said second pair of laser diodes.

3. The raster output scanner of claim 1, wherein said optical separator means includes at least one polarization separating filter.

4. The raster output scanner of claim 1, wherein said deflecting means is mounted for rotation about a central axis.

5. The raster output scanner of claim 1, wherein said light source includes a plurality of laser diodes arranged in a line extending perpendicular to said central axis of said deflecting means.

6. The raster output scanner of claim 2, further comprising:
    means for collimating the light beams output by said laser diodes prior to said light beams reaching said polarization means.

7. The raster output scanner of claim 1, wherein said plurality of light beams output by said laser diodes have similar polarizations and each said light beam has a similar maximum divergence angle prior to reaching said polarization means.

8. The raster output scanner of claim 2, wherein said polarization means includes a first half-wave plate positioned in a path of one of said light beams emitted by said first pair of laser diodes, and a second half-wave plate positioned in a path of one of said light beams emitted by said second pair of laser diodes.

9. A raster output scanner for a four station printer, comprising:

first, second, third and fourth laser diodes for emitting clustered adjacent first, second, third and fourth laser beams having similar polarizations, said first and second laser beams having similar wavelengths and said third and fourth laser beams having similar wavelengths different from the wavelength of said first and second laser beams;

polarization means for rotating a polarization angle of said first and fourth laser beams;

a polygon mirror mounted for rotation about a central axis for simultaneously deflecting said clustered laser beams onto a first optical path, said clustered laser beams remaining separate during deflection by said polygon mirror;

a first optical separator, disposed on said first optical path, for directing said first laser beam and said second laser beam onto a disparate second optical path and for directing said third laser beam and said fourth laser beam onto a disparate third optical path according to a wavelength of said laser beams;

a second optical separator, disposed on said second optical path, for directing said first laser beam onto a disparate fourth optical path and for directing said second laser beam onto a disparate fifth optical path according to a polarization of said first and second laser beams; and a third optical separator, disposed on said third optical path, for directing said third laser beam onto a disparate sixth optical path and for directing said fourth laser beam onto a disparate seventh optical path according to a polarization of said third and fourth laser beams.

10. The raster output scanner of claim 9, further comprising:

optical path length compensating means for maintaining the optical path of said second and third laser beams equal to the optical path length of said first and fourth laser beams.

11. The raster output scanner of claim 10, wherein said optical path length compensating means includes a glass plate located in a path of said second and third laser beams.

12. The raster output scanner of claim 9, wherein said first, second third and fourth lasers are disposed on a single chip.

13. The raster output scanner of claim 9, wherein said first, second, third and fourth lasers are located on individual chips integrally attached to each other.

14. The raster output scanner of claim 9, wherein said polarization means includes a first half-wave plate located in a path of said first laser beam, and a second half-wave plate located in a path of said fourth laser beam.

15. The raster output scanner of claim 9, wherein:
said first optical separator is a wavelength discriminating mirror; and
said second optical separator and said third optical separator are polarized beam separating prisms.

16. The raster output scanner of claim 9, wherein:
said first optical separator is a wavelength discriminating mirror; and
said second optical separator and said third optical separator are polarized beam separating multiple layer films.

17. The raster output scanner of claim 9, further comprising:
laser beam collimating means for collimating said laser beams prior to said laser beams reaching said polarization means.

18. The raster output scanner of claim 17, wherein said collimating means is a GRIN rod located in a path of each of said beams.

19. The raster output scanner of claim 9, wherein said first, second, third and fourth laser beams have a similar polarization and a similar maximum divergence angle prior to reaching said polarization means.

20. The raster output scanner of claim 9, wherein said first, second, third and fourth laser diodes are arranged in a line extending perpendicular to said central axis of said polygon mirror.

21. A printer comprising:

beam generating means for producing a plurality of clustered light beams, including pairs of light beams, wherein each beam within a pair has similar wavelengths, and each pair has dissimilar wavelengths;

polarization means for rotating the polarization of at least one of said light beams within each said pair of light beams;

a polygon mirror mounted for rotation about a central axis for simultaneously deflecting said light beams onto a first optical path, said light beams remaining separate during deflection by said polygon mirror;

optical separator means for differentially passing and reflecting said light beams according to wavelength and polarization, onto disparate optical paths; and a plurality of photoreceptors, each photoreceptor receiving one of said light beams.

22. The printer of claim 21, wherein said polarization means includes a half-wave plate.

23. The printer of claim 22, further comprising:
optical path length compensating means for adjusting the optical path length of at least one of said light beams within each said pair of light beams.

24. The printer of claim 23, wherein said optical path length compensating means includes a glass plate.

25. The printer of claim 21, wherein said beam generating means is a plurality of laser diodes disposed on a single chip.

26. The printer of claim 21, wherein said beam generating means is a plurality of chips, each containing an individual laser diode, said chips being integrally attached to each other.

27. The printer of claim 21, further comprising:
means for collimating said light beams prior to said light beams reaching said polarization means.

28. The printer of claim 21, wherein said plurality of clustered light beams are arranged in a line extending perpendicular to the central axis of said polygon mirror.

29. The printer of claim 21, wherein said plurality of light beams have similar polarizations and similar maximum divergence angles prior to said light beams reaching said polarization means.

30. A printer comprising:

beam generating means for producing a plurality of clustered light beams, including pairs of light beams, wherein each beam within a pair has similar wavelengths, and each pair has dissimilar wavelengths;

polarization means for rotating the polarization of at least one of said light beams within each said pair of light beams;

a polygon mirror mounted for rotation about a central axis for simultaneously deflecting said clustered light beams onto a first optical path, said clustered light beams remaining separate during deflection by said polygon mirror.

31. The printer of claim 30, wherein said polarization means includes a half-wave plate.

32. The printer of claim 31, further comprising:
optical path length compensating means for adjusting the optical path length of at least one of said light beams within each said pair of light beams.

33. The printer of claim 32, wherein said optical path length compensating means includes a glass plate.

34. The printer of claim 30, wherein said beam generating means is a plurality of laser diodes disposed on a single chip.

35. The printer of claim 30, wherein said beam generating means is a plurality of chips, each containing an individual laser diode, said chips being integrally attached to each other.

36. The printer of claim 30, further comprising:
means for collimating said light beams prior to said light beams reaching said polarization means.

37. The printer of claim 30, wherein said plurality of clustered light beams are arranged in a line extending perpendicular to the central axis of said polygon mirror.

38. The printer of claim 30, wherein said plurality of light beams have similar polarizations and similar maximum divergence angles prior to said light beams reaching said polarization means.

* * * * *